United States Patent [19]
Kajimoto

[11] Patent Number: 5,436,552
[45] Date of Patent: Jul. 25, 1995

[54] CLAMPING CIRCUIT FOR CLAMPING A REFERENCE VOLTAGE AT A PREDETERMINED LEVEL

[75] Inventor: Takeshi Kajimoto, Hyogo, Japan

[73] Assignee: Mitsubishi Denki Kabushiki Kaisha, Tokyo, Japan

[21] Appl. No.: 123,964

[22] Filed: Sep. 21, 1993

[30] Foreign Application Priority Data

Sep. 22, 1992 [JP] Japan .................. 4-252850

[51] Int. Cl.⁶ ........................... G05F 3/16
[52] U.S. Cl. ........................................ 323/313
[58] Field of Search ............... 323/312, 313, 314, 315, 323/317; 307/296.1, 296.3, 296.5, 296.6, 296.8; 330/288

[56] References Cited

U.S. PATENT DOCUMENTS

| | | | |
|---|---|---|---|
| 4,874,967 | 10/1989 | Deane | 307/296.8 |
| 4,926,065 | 5/1990 | Coy et al. | 307/475 |
| 5,132,936 | 7/1992 | Keswick et al. | 323/313 |
| 5,311,071 | 5/1994 | Ueda | 307/355 |

FOREIGN PATENT DOCUMENTS

| | | | |
|---|---|---|---|
| 496424A2 | 7/1992 | European Pat. Off. | G05F 1/46 |
| 2238890 | 6/1991 | United Kingdom | G05F 1/613 |
| 2250358 | 6/1992 | United Kingdom | G05F 1/575 |

OTHER PUBLICATIONS

"Analog Integrted Circuit Design Technology for VLSI", by P. R. Gray, et al, *Analysis and Design of Analog Integrated Circuits 2nd Edition*, John Wiley & Sons Publishing (A Japanese copy).

*Primary Examiner*—Steven L. Stephan
*Assistant Examiner*—Matthew V. Nguyen
*Attorney, Agent, or Firm*—Lowe, Price, Leblanc & Becker

[57] ABSTRACT

A clamping circuit includes a constant current circuit including a constant current source and a current mirror circuit a trimmable resistance receiving a constant current from the constant current circuit, and a clamping MOS transistor receiving a voltage generated by the trimmable resistance at its gate to regulate a current flowing through a clamping node. It is possible to make rapid a current-voltage characteristic of the clamping circuit, and to set an arbitrary clamping potential.

16 Claims, 9 Drawing Sheets

CLAMPING CIRCUIT FOR CLAMPING A REFERENCE VOLTAGE AT A PREDETERMINED LEVEL

BACKGROUND OF THE INVENTION

1. Field of the Invention

The present invention generally relates to clamping circuits, and more particularly, to a circuit configuration for clamping a voltage generated in a semiconductor device to a constant voltage.

2. Description of the Background Art

Recently, a semiconductor device is configured by using a single power source (a configuration using one kind of power supply voltage in addition to a power supply potential serving as a ground potential in general) in order to facilitate system build-up. On the other hand, in a semiconductor device such as a semiconductor memory, a potential which is different from an external or internal power supply voltage Vcc is often required. In such a case, a potential required in the semiconductor device is generated from the power supply voltage Vcc.

Figure 9:
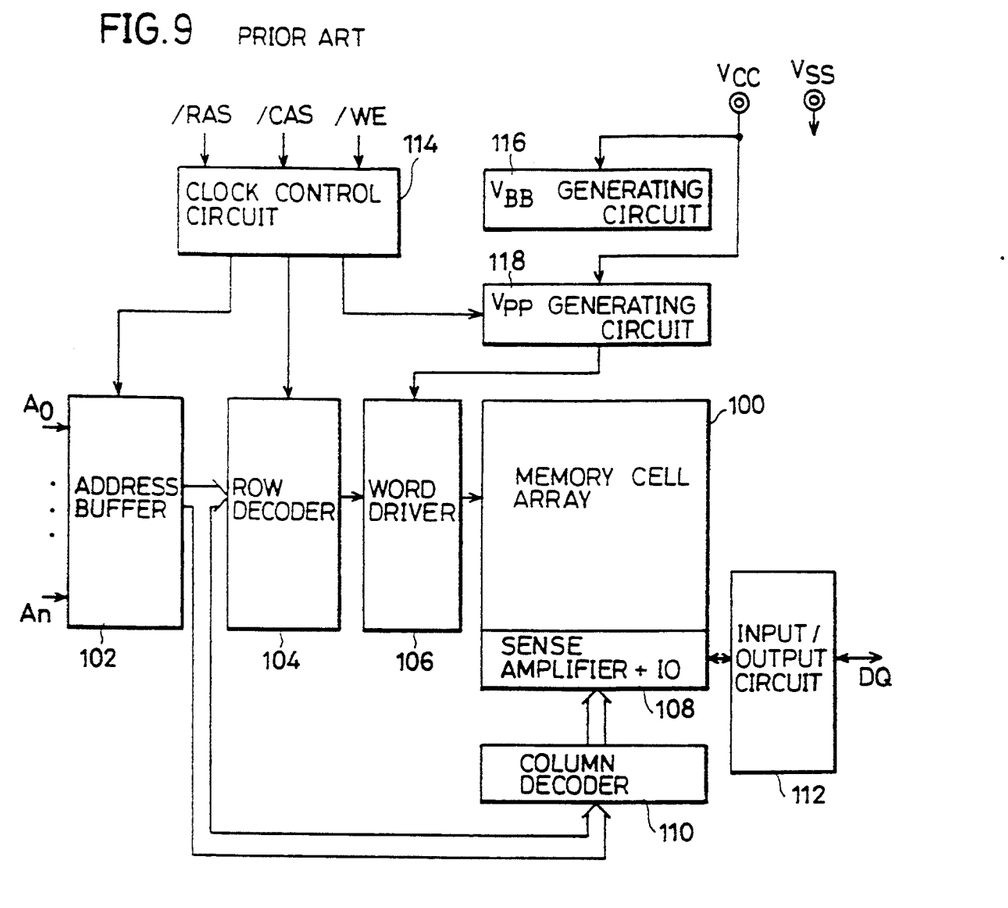
FIG. 9 is a diagram showing a general configuration of a semiconductor memory.

FIG. 9 is a diagram showing a general configuration of a semiconductor memory. In FIG. 9, a configuration of a dynamic random access memory is shown as an example of a semiconductor memory.

In FIG. 9, the semiconductor memory includes a memory cell array 100 having a plurality of dynamic type memory cells arranged in a matrix of rows and columns, an address buffer 102 generating an internal address signal according to an externally applied address signal A0 to An, a row decoder 104 decoding an internal row address signal from address buffer 102 to generate a signal selecting a corresponding row in memory cell array 100, a word driver 106 transmitting a word line driving signal to a corresponding row in memory cell array 100 in response to a row select signal from row decoder 104, a column decoder 110 decoding an internal column address signal from address buffer 102 to generate a signal for selecting a corresponding column in memory cell array 100, a sense amplifier for sensing and amplifying storage data of a memory cell connected to the selected row in memory cell array 100, and an IO gate for connecting a corresponding column in memory cell array 100 to an internal data line in response to a column select signal from column decoder 110. In FIG. 9, the sense amplifier and the IO gate are shown in one block 108.

The semiconductor memory further includes an input/output circuit 112 for carrying out input/output of data to and from the outside of the memory, a clock control circuit 114 for generating various internal control signals in response to externally applied control signals /RAS ("/" before reference characters indicating that a signal is active or asserted at a low level), /CAS and /WE, a VBB generating circuit 116 for applying a predetermined bias voltage VBB to a semiconductor substrate on which the semiconductor memory is formed, and a Vpp generating circuit 118 for generating a boost signal Vpp higher than the power supply voltage Vcc to be transmitted to the selected row of memory cell array 100.

The signal /RAS is a row address strobe signal. The signal /RAS determines a memory cycle of the semiconductor memory, as well as gives a timing at which address buffer 102 takes in the row address signal. The signal /CAS is a column address strobe signal. The signal /CAS gives a timing at which address buffer 102 takes in the column address signal, as well as an operating timing of circuitry associated with column selection of the semiconductor memory. The signal /WE is a write enable signal. The signal /WE determines whether the semiconductor memory is in a data reading mode or a data writing mode. The various internal control signals generated from clock control circuit 114 are applied to various circuit portions. However, in FIG. 9, it is simply shown that they are applied to address buffer 102, row decoder 104, and Vpp generating circuit 118. Operations will now be described briefly.

The semiconductor memory shown in FIG. 9 is a dynamic random access memory. A row address signal and a column address signal are applied to address buffer 102 in a time division multiplexed manner. Address buffer 102 takes in an external address signal in response to an internal control signal generated in response to the signal /RAS from clock control circuit 114 to generate an internal row address signal. Row decoder 104 decodes the internal row address signal to generate a signal selecting a row (a word line) in memory cell array 100.

Vpp generating circuit 118 receives the power supply voltage Vcc (in FIG. 9, Vcc is shown being applied externally) to generate the boost signal Vpp in response to an internal control signal from clock control circuit 114. Word driver 106 transmits the boost signal Vpp applied from Vpp generating circuit 118 onto a row (a word line) in memory cell array 100 designated by a row select signal from row decoder 104. As a result, one row is brought into a selected state in memory cell array 100, and storage data of a memory cell connected to the selected row is transmitted onto a corresponding column (a bit line). Then, the sense amplifier included in block 108 is activated (by a control signal from clock control circuit 114), and storage data of a memory cell transmitted onto each column is amplified.

On the other hand, address buffer 102 generates an internal column address signal from an external address signal in response to an internal control signal generated from clock control circuit 114 in response to the signal /CAS. Column decoder 110 decodes an internal column address signal from address buffer 102 to generate a column select signal. Data of each memory cell has already been sensed and amplified by the sense amplifier in block 108 at the time of generating the column select signal, whereby data on each column has been brought into a stable state.

The IO gate in block 108 is rendered conductive in response to a column select signal from column decoder 110 to connect a corresponding column in memory cell array 100 to input/output circuit 112. Input/output circuit 112 is responsive to a control signal from clock control circuit 114 for generating internal write data from external write data to transmit the resultant data to block 108 in a data writing operation mode, and for generating external read data from internal read data transmitted from the IO gate in block 108 in a data reading operation mode.

As described above, writing or reading of data is carried out for a memory cell arranged corresponding to a crossing of a row and a column selected by row decoder 104 and column decoder 110. Description will now be given on functions of the boost signal Vpp transmitted onto the selected row in memory cell array 100.

Figure 10:
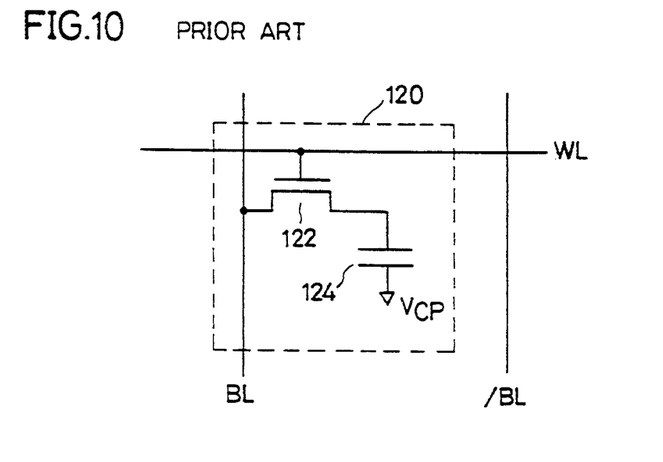
FIG. 10 is a diagram showing a memory cell configuration of the semiconductor memory shown in FIG. 9.

FIG. 10 is a diagram showing a configuration of a dynamic type memory cell. In FIG. 10, a dynamic type memory cell 120 includes a memory cell capacitor 124 for storing information in the form of electric charges, and a transfer gate 122 responsive to a signal potential on a word line WL for connecting memory cell capacitor 124 to a corresponding bit line (a bit line BL in FIG. 10). Memory cell capacitor 124 has one electrode (a cell plate) connected to a predetermined reference potential Vcp. The word line WL corresponds to a row of memory cell array 100 shown in FIG. 9, and bit lines BL and /BL correspond to a column of memory cell array 100 shown in FIG. 9. Bit lines BL and /BL constitute a pair, and memory cell 120 is disposed at a crossing of one word line and a pair of bit lines BL, /BL. In FIG. 10, the state is shown where memory cell 120 is disposed at a crossing of the word line WL and the bit line BL. Ordinarily, another dynamic type memory cell is disposed at a crossing of an adjacent word line and the bit line /BL. Sensing operation of data of the dynamic type memory cell shown in FIG. 10 will now be described with reference to an operating waveform diagram shown in FIG. 11.

When the word line WL is selected, the boost signal Vpp is transmitted onto the word line WL from word driver 106 shown in FIG. 9. As a result, transfer gate 122 in memory cell 120 is rendered conductive, and memory cell capacitor 124 is coupled to the bit line BL. The bit lines BL and /BL are precharged to an intermediate potential (Vcc/2) at the time of stand-by, and brought into an electrically floating state before the potential of the word line rises. This causes electric charges to move between the bit line BL and memory cell capacitor 124, and the potential of the bit line BL changes according to storage data of memory cell capacitor 124. In the state shown in FIG. 11, memory cell 120 stores data "0", and the potential of the bit line BL decreases. The other bit line /BL does not have the selected memory cell connected thereto, and therefore holds the precharge potential Vcc/2.

Figure 11:
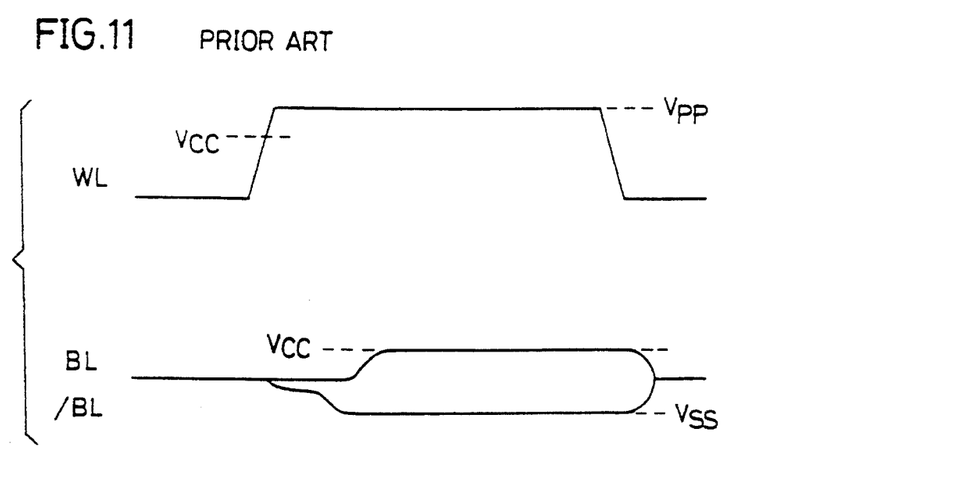
FIG. 11 is a waveform diagram showing operations at the time of reading data of the memory cell shown in FIG. 10.

Then, the sense amplifier is activated to differentially amplify the potential difference between the bit lines BL and /BL. After writing or reading of data to and from memory cell 120 is carried out, one memory cycle is completed, and the potential of the word line WL falls to an "L" level.

Transfer gate 122 in dynamic type memory cell 120 is ordinarily constituted of an n channel MOS transistor (an insulating gate type field effect transistor), as shown in FIG. 10. Therefore, transfer gate 122 can pass a voltage of the potential applied to its gate less its own threshold voltage. If the potential of the word line WL is at a level of the power supply voltage Vcc, a voltage Vcc-Vth is transmitted to memory cell capacitor 124. Vth is a threshold voltage of transfer gate 122.

As memory capacity of the semiconductor memory increases, the size of the memory cell decreases. When C represents a capacitance and V represents a transmitted potential, an amount of storage electric charges Q is expressed as follows:

$$Q = C \cdot (V - Vcp)$$

As shown in the above equation, in order to store sufficient electric charges in the memory cell capacitor, it is necessary to make the transmitted voltage V as large as possible. Therefore, the potential of the word line WL is boosted above the power supply voltage Vcc in order to transmit the power supply voltage Vcc to memory cell capacitor 124. By transmitting the boost signal Vpp at the time of rising of the potential of the word line WL, the rising rate of the potential of the word line WL is increased, and storage data of memory cell 120 is transmitted onto the bit line BL at a high speed.

Such boost voltage Vpp is generated on-chip from the power supply voltage Vcc by using a boosting circuit using a capacitive coupling by bootstrap capacitance, a boosting circuit using a charge pump operation, or the like.

Figure 12:
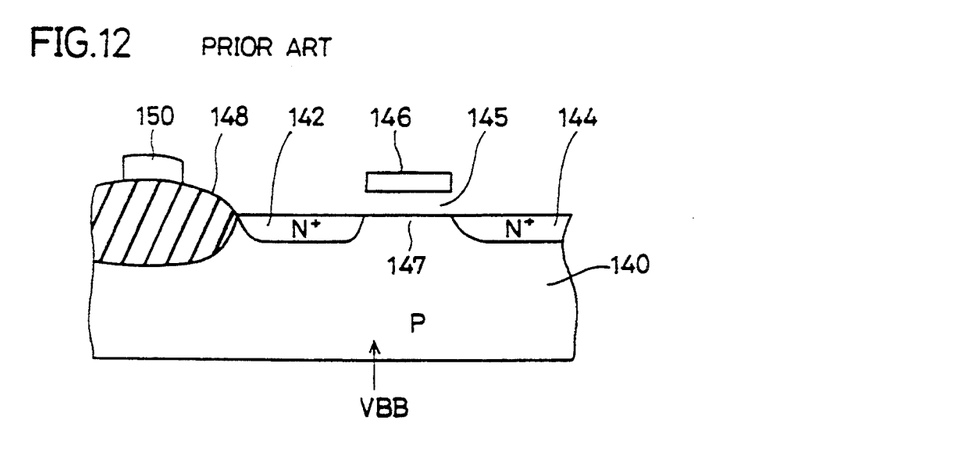
FIG. 12 is a diagram for explaining functions of a substrate bias voltage in the semiconductor memory.

FIG. 12 is a diagram showing functions of a substrate bias voltage generated from the VBB generating circuit shown in FIG. 9. In FIG. 12, a cross-sectional structure of one MOS transistor is shown. In FIG. 12, the MOS transistor includes N type impurity regions 142 and 144 of high impurity concentration formed on the surface of a P type semiconductor substrate (or a P well), and a gate electrode 146 formed on the substrate surface between impurity regions 142 and 144 with a gate insulating film 145 interposed therebetween.

The MOS transistor shown in FIG. 12 is an n channel type transistor. When a voltage of an "H" level is applied to gate electrode 146, an inversion layer is formed in a channel region 147 under gate electrode 146, and impurity regions 142 and 144 are connected through the inversion layer of low resistance in the surface of channel region 147. As a result, the MOS transistor is brought into an on state. A threshold voltage Vth of such an MOS transistor changes depending on a surface impurity concentration of channel region 147. The surface impurity concentration is varied depending on various parameters of the manufacturing process.

In order to suppress variation of the threshold voltage caused by such variation of the impurity concentration, a constant bias potential VBB is applied to semiconductor substrate 140. Ordinarily, a negative voltage of $-2$ to $-3$ V is applied to P type semiconductor substrate 140 in order to stabilize the threshold voltage of the MOS transistor. By applying the bias voltage VBB, junction capacitance formed between impurity regions 142 or 144 and semiconductor substrate 140 decreases, thereby improving an operating speed of the MOS transistor.

The MOS transistor is electrically isolated from the adjacent cell by a cell isolating region (a cell isolating oxide film) 148. A signal line 150 is disposed on cell isolating region 148. In this configuration, an inversion layer is formed under cell isolating region 148 by a voltage applied to the signal line or interconnection layer 150. The bias voltage VBB serves to prevent a parasitic MOS transistor from being rendered conductive.

Such substrate bias voltage VBB is also generated on-chip in the semiconductor memory by using a circuit such as a charge pump circuit (using a capacitor) from the power supply voltage Vcc.

A voltage signal generated on-chip in the semiconductor memory includes a sense amplifier connection control signal in a shared sense amplifier configuration in addition to the word line boost signal and the substrate bias voltage as described above.

Figure 13:
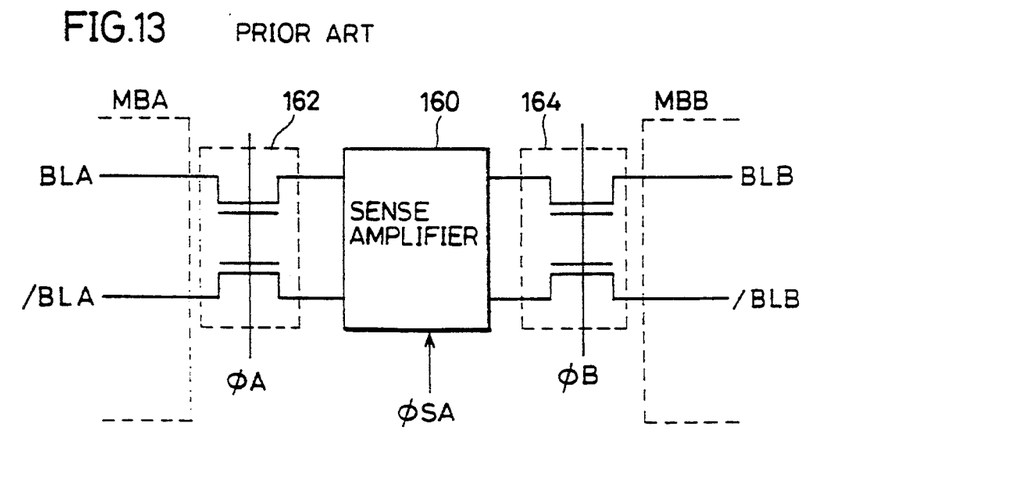
FIG. 13 is a diagram showing a shared sense amplifier arrangement of a semiconductor memory.

FIG. 13 is a diagram showing an arrangement of the shared sense amplifier in the semiconductor memory. In FIG. 13, a sense amplifier 160 is shared by a bit line pair BLA, /BLA of a memory block MBA and a bit line pair BLB, /BLB of a memory block MBB. The bit line pair BLA, /BLA of the memory block MBA and sense amplifier 160 are connected through a connection gate 162, and sense amplifier 160 and the bit line pair BLB, /BLB of the memory block MBB are connected through a connection gate 164. Description will now be given on sensing operation of memory cell data using the shared sense amplifier shown in FIG. 13 with reference to its operating waveform diagram shown in FIG. 14.

When the signal /RAS falls, one memory cycle starts. In response to falling of the signal /RAS, a decoding operation of the row address signal and a word line selecting operation are carried out. In parallel with these operations, only the memory block including a selected word line is connected to sense amplifier 160, and the other memory block is disconnected from sense amplifier 160. In the state before this, sense amplifier 160 is connected to bit line pairs BLA, /BLA, and BLB, /BLB. Control of connection/disconnection between sense amplifier 160, and the bit line pairs BLA, /BLA and BLB, /BLB is carried out by control signals $\phi$A and $\phi$B, respectively.

Figure 14:
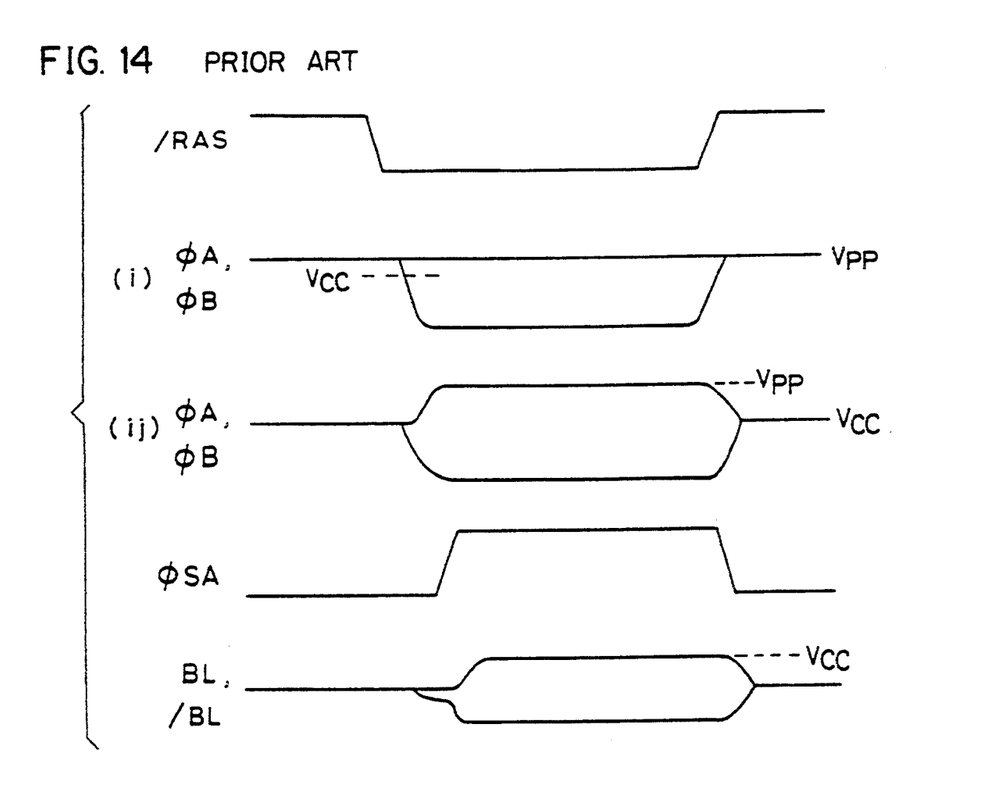
FIG. 14 is a signal waveform diagram showing operations at the time of sensing of the semiconductor memory of the shared sense amplifier arrangement shown in FIG. 13.

Various methods are considered as manners of generating the control signals $\phi$A and $\phi$B. As shown in FIG. 14 (i), at the time of stand-by, both the control signals $\phi$A and $\phi$B maintain the boost signal Vpp level, and the control signal $\phi$A or $\phi$B for a non-selected memory block (a memory block not including a selected word line) falls to the ground potential Vss level. As a result, only a bit line pair of one memory block is connected to sense amplifier 160.

In place of the above configuration, as shown in FIG. 14 (ii), both the control signals $\phi$A and $\phi$B are at the power supply voltage Vcc level at the time of stand-by, the control signal for the selected memory block attains the boost signal Vpp level, and the control signal for the non-selected memory block attains the ground potential Vss level. In any methods, as for the selected memory block, the connection gate is rendered conductive by the control signal of the boost signal Vpp level, thereby connecting the bit line pair and sense amplifier 160.

After connection of the selected memory cell block and sense amplifier 160 and disconnection of the non-selected memory cell block and sense amplifier 160, the sense amplifier activation signal $\phi$SA is activated, and sense amplifier 160 carries out a sensing operation. As a result, data of the memory cell connected to the selected word line is sensed and amplified.

As described above, by applying the signals $\phi$A and $\phi$B of the boost signal Vpp level to connections gate 162 or 164 at the time of sensing operation, transmission loss of a signal in connection gate 162 or 164 (caused by the threshold voltage of the MOS transistor constituting the connection gate) is eliminated, the signal of the power supply voltage Vcc level is reliably transmitted onto a bit line.

In the shared sense amplifier configuration as described above, the memory cell array block is divided into two. Therefore, the length of a bit line in each memory cell array is shortened, and bit line capacitance can be made small, whereby it is possible to transmit a sufficient read out voltage onto a bit line at a high speed.

Figure 15:
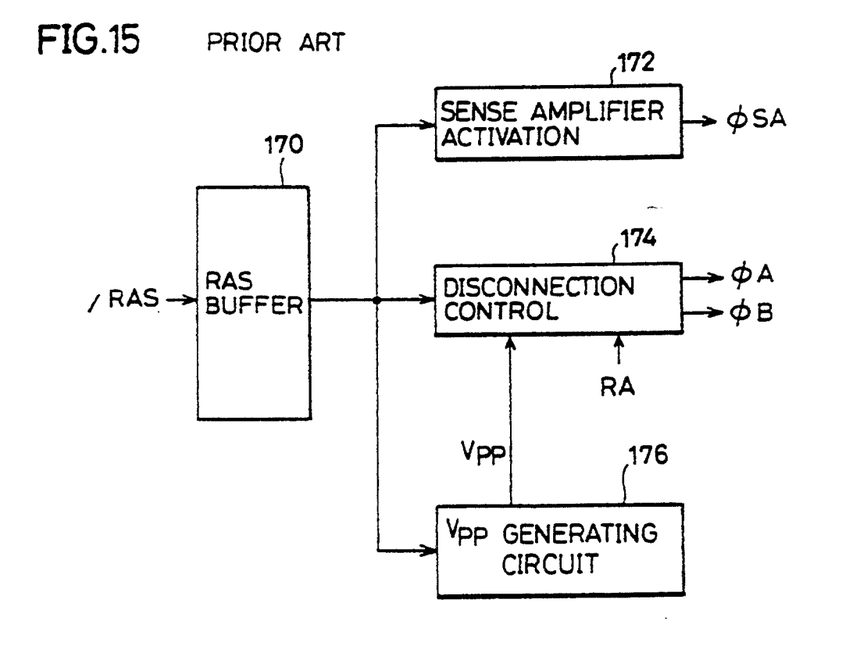
FIG. 15 is a block diagram showing a circuit configuration for generating each control signal shown in FIG. 13.

FIG. 15 is a diagram showing schematically a configuration for generating each control signal in the shared sense amplifier arrangement shown in FIG. 13. In FIG. 15, circuitry for generating shared sense control signals includes a RAS buffer 170 receiving the external signal /RAS for generating the internal RAS signal, a sense amplifier activating circuit 172 receiving the internal RAS signal from RAS buffer 170 for generating the sense amplifier activation signal $\phi$SA at a predetermined timing, a Vpp generating circuit 176 generating the boost signal Vpp at a predetermined timing in response to the internal RAS signal from RAS buffer 170, and a disconnection control circuit 174 generating the disconnection control signals $\phi$A and $\phi$B in response to the internal RAS signal, the internal address signal RA, and the boost signal Vpp. As the internal address signal RA, for example, a higher bit of the internal row address signal is used. It is possible to identify a memory block including a selected word line by a predetermined number of higher bits of the row address signal RA. Vpp generating circuit 176 generates the boost signal Vpp on-chip from the power supply voltage Vcc.

As described above, in the semiconductor memory, signals of various voltage levels are generated on-chip from the power supply voltage Vcc. Not only in the dynamic random access memory but also in EEPROM such as a flash memory (an electrically programmable and erasable semiconductor memory device), a program voltage required at the time of programming operation is generated on-chip from the power supply voltage Vcc.

When the boost signal Vpp and the substrate bias voltage VBB are generated on-chip from the power supply voltage Vcc, in order to ensure an operating margin, a voltage of a predetermined level or more (or in the case of a negative voltage, a voltage of a predetermined level or less) is required.

On the other hand, as a semiconductor device such as a semiconductor memory is made high in density, the size of components is more and more miniaturized. Therefore, from the standpoint of breakdown voltage of the components, it is necessary to prevent application of a higher voltage than required. For example, when the boost signal Vpp is applied as a word line drive signal, if a higher voltage than required is applied to a word line, word line destruction (open-circuit of a word line, dielectric breakdown of an interlayer insulating film) or the like occurs.

Also in the case of the substrate bias voltage VBB of a negative voltage, when a PN junction is in a reverse-biased state and a negative potential of the substrate bias voltage VBB is decreased more than required, it is considered that the reverse-biased state of the PN junction is further enhanced, causing destruction of the PN junction (the case where a signal of an "H" level is applied to an N region).

Figure 16:
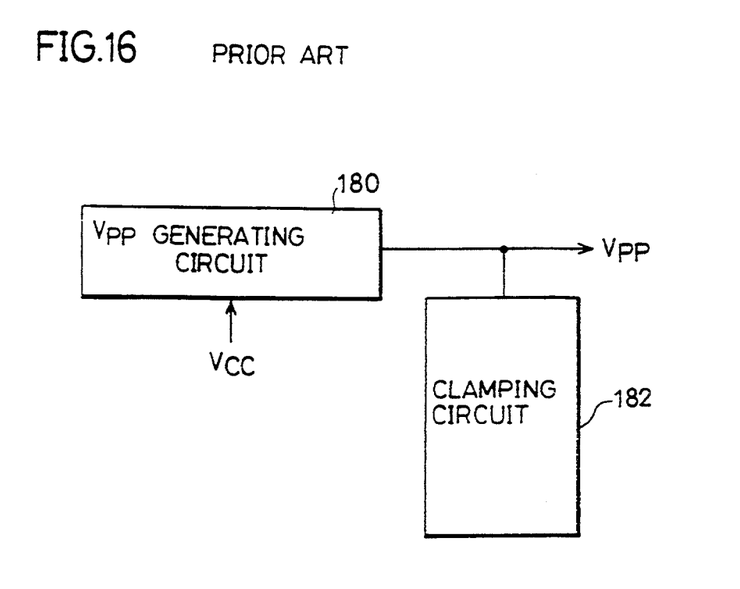
FIG. 16 is a diagram showing a configuration of a section generating a boost signal in the semiconductor memory.

In order to prevent generation of a voltage of a level higher than required, a clamping circuit is generally provided as shown in FIG. 16. In FIG. 16, a configuration in which a voltage level of the boost signal Vpp generated by a Vpp generating circuit 180 is clamped at a certain level, is shown as an example. A configuration of a circuit generating the substrate bias voltage VBB is similar thereto. A clamping circuit 182 serves to prevent a level of the boost signal Vpp generated from Vpp generating circuit 180 from exceeding a predetermined voltage level.

Figure 17:
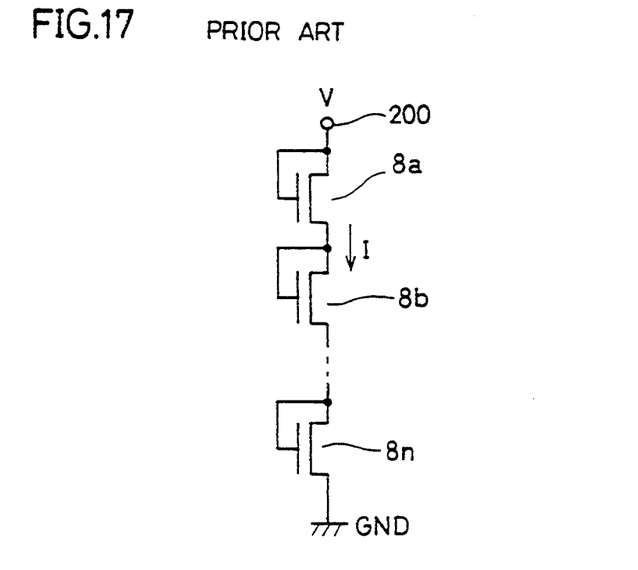
FIG. 17 is a diagram showing a configuration of a conventional clamping circuit.
Figure 18:
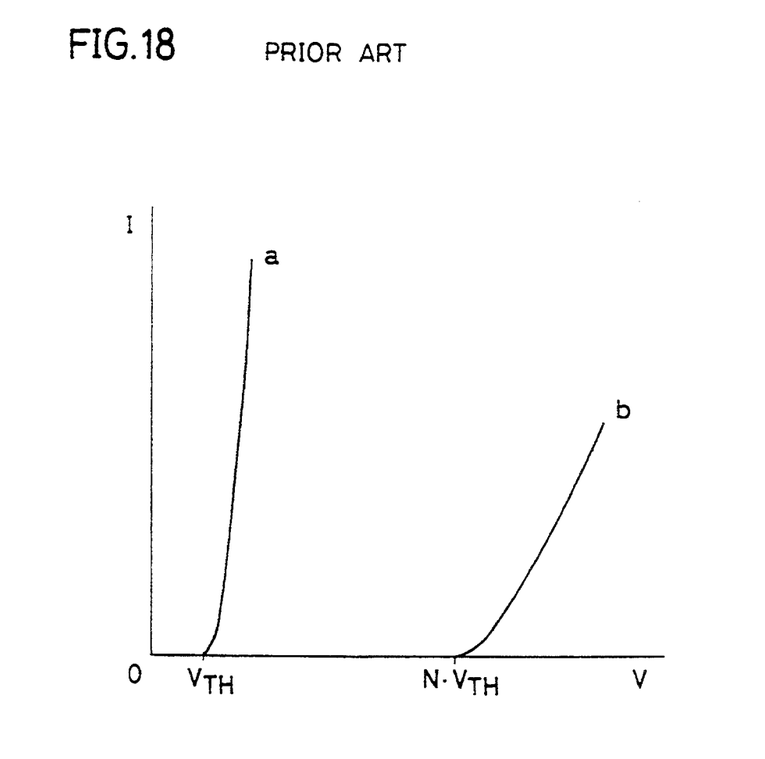
FIG. 18 is a diagram showing a current-voltage characteristic of the conventional clamping circuit and a voltage-current characteristic of one MOS transistor.

FIG. 17 is a diagram showing a specific configuration of the clamping circuit shown in FIG. 16. In FIG. 17, the clamping circuit includes MOS transistors 8a to 8n connected in series between a node 200 and a node supplying a ground potential (GND) serving as a reference potential. Each of the MOS transistors 8a to 8n is diode-connected to cause voltage drop of its own threshold voltage Vth. Node 200 is coupled to a signal line to which the boost signal Vpp is transmitted. Operations of the clamping circuit shown in FIG. 17 will now be described with reference to a voltage-current characteristic shown in FIG. 18. In FIG. 18, the ordinate shows a current I and the abscissa shows a voltage V. A curve a shows a voltage-current characteristic of one MOS transistor, and a curve b shows a voltage-current characteristic in the clamping circuit shown in FIG. 17.

Each of the MOS transistors 8a to 8n has its gate terminal and drain terminal connected, and operates in a saturation region. The voltage-current characteristic of the MOS transistor in the saturation region is given by the curve a shown in FIG. 18. More specifically, when a current Ids flows through one MOS transistor, the voltage-current characteristic is given by the following equation:

$$Ids = \beta(Vgs - Vth)^2$$

In the equation, Ids represents a drain current, Vgs represents a voltage between gate and source, and Vth represents a threshold voltage. A coefficient $\beta$ is a constant determined by geometrical configuration and the like of the MOS transistor. The voltage-current characteristic of one MOS transistor is a square characteristic.

When the number of MOS transistors 8a to 8n used in the clamping circuit shown in FIG. 17 is N, the current I flowing from node 200 to the ground potential (reference potential supply node) GND is given by the following equation, providing that the threshold voltages Vth of respective MOS transistors 8a to 8n are all equal:

$$\begin{aligned} I &= \beta \cdot (V/N - Vth)^2 \\ &= (\beta/N^2) \cdot (V - N \cdot Vth)^2 \end{aligned}$$

It is possible to provide the above equation on condition that on-resistances of the MOS transistors 8a to 8n are equal, voltages between drain and source applied to respective MOS transistors 8a to 8n are the same, and that values of current flowing through respective MOS transistors 8a to 8n are the same.

In the above-described equation, when the voltage V at node 200 satisfies the relation V>N·Vth, the current I flows. More specifically, in a conventional clamping circuit, N times of the threshold voltage Vth of each of the MOS transistors 8a to 8n, which are components, is taken as a reference voltage. When the voltage V at node 200 exceeds the value N·Vth, a current flows from node 200 to the ground potential GND, causing the potential at node 200 to decrease. As a result, unnecessary increase of the voltage V at node 200 is prevented.

However, as described above, when the MOS transistors are connected just in series, a voltage applied across to one MOS transistor is V/N. Therefore, as seen in the above equation, the voltage-current characteristic of the clamping circuit provides a curve more gentle than that of a single MOS transistor, as shown by the curve b of FIG. 18. More specifically, in the clamping circuit shown in FIG. 17, an amount of change of the current I with respect to change of the voltage V at node 200 is $1/N^2$ of that of the single MOS transistor, whereby it is not possible to make a rapid current flow according to the change of the voltage V at node 200. Therefore, it is not possible to respond to the change of the voltage V at node 200 at a high speed, causing problems that an amount of current at the time of clamping operation is insufficient, and that a leak current flows when not required.

Since the clamping potential is determined by an integer multiple of the threshold voltage Vth of the MOS transistor, only discrete values can be implemented as clamping potentials, causing a problem that an arbitrary clamping potential cannot be set easily.

As the number of MOS transistors included in the clamping circuit increases, the MOS transistor distant from the ground potential GND is more affected by a substrate effect, thus having larger threshold voltage Vth. More specifically, when the substrate potential is constant in respective MOS transistors 8a to 8n, the source potential increases as the MOS transistor becomes distant from the ground potential GND, causing the difference between the source potential and the substrate potential to increase. As a result, the substrate bias voltage increases effectively, and the threshold voltage of the MOS transistor increases. Therefore, another problem occurs that it is difficult to subtly adjust the clamping potential.

SUMMARY OF THE INVENTION

One object of the present invention is to provide a clamping circuit in which a desired clamping potential can be easily set, and in which clamping operation can be carried out precisely at a high speed by precisely following variation of a voltage to be clamped.

A clamping circuit according to one aspect of the present invention includes a reference voltage generating circuit provided between a clamping node (a first node) and a reference potential supply node for generating a predetermined reference voltage different from the reference potential, and a clamping transistor element having one conduction terminal connected to the clamping node, the other conduction terminal connected to the reference potential supply node, and its control electrode node connected to receive the predetermined reference voltage from the reference voltage generating circuit.

A clamping circuit according to another aspect of the present invention includes a constant current supplying circuit provided between the clamping node (the first node) and a second node supplying the reference potential for supplying a constant current to its output node, a voltage generating circuit including a trimming resistive component for generating a voltage according to a current which the constant current supplying circuit supplies, and a clamping circuit including one field effect transistor element and responsive to a voltage generated by the voltage generating circuit for adjusting an amount of current flowing between the clamping node and the second node to clamp a potential of the first node to a predetermined potential.

In the clamping circuit according to the one aspect, one transistor element is used as a circuit for clamping the clamping node. The transistor element receives the reference voltage at its control electrode node. As a result, it is possible to cause a current flow according to the potential difference between the control electrode node and the clamping node. Since one transistor element is used as the clamping circuit, change of the current flowing through the transistor element becomes rapid according to the potential change of the clamping node, causing the potential of the clamping node to be clamped to a predetermined potential precisely at a high speed.

In the clamping circuit according to the another aspect of the present invention, the voltage generating circuit generates a trimmable constant voltage according to a constant current, and the clamping circuit is constituted of one field effect transistor. Therefore, it is possible to cause a current flow amount changing at a high speed according to the potential of the clamping node between the clamping node and the reference potential node (the second node), whereby it is possible to carry out clamping operation according to the potential change which appears at the clamping node precisely at high speed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
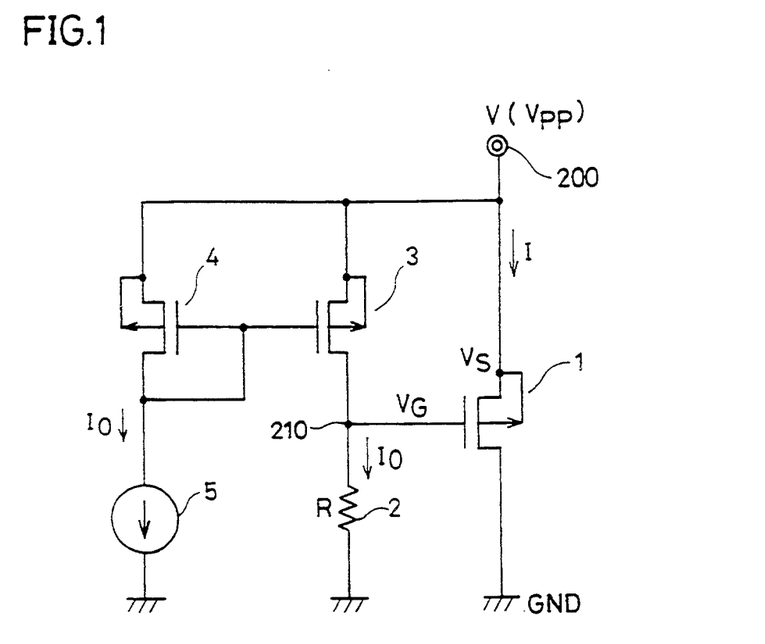
FIG. 1 is a diagram showing a configuration of a clamping circuit of one embodiment of the present invention.

FIG. 1 is a diagram showing a configuration of the clamping circuit of one embodiment of the present invention. The clamping circuit shown in FIG. 1 clamps a potential level of a boost signal Vpp which appears at a node 200 serving as a first node or a clamping node. In FIG. 1, the clamping circuit includes a clamping transistor 1 provided between node 200 and a node supplying a reference potential (ground potential GND) for clamping a potential V which appears at node 200 to a predetermined potential level, a trimmable resistance 2 for applying a gate voltage VG of clamping transistor 1, transistors 3, 4 for supplying a constant current Io to resistance 2, and a constant current source 5.

Clamping transistor 1 is constituted of a p channel MOS transistor having its source and a substrate coupled to node 200, and its drain connected to a reference potential supply node (hereinafter simply referred to as a "ground potential GND").

Resistance 2 is constituted of a trimmable resistance such as a polysilicon resistance, with its resistance value set to a desired value R. As a trimming method, a laser anneal method or the like can be used. Resistance 2 may be constituted of a plurality of resistive elements arranged in parallel, with each resistance connected to the ground potential GND through a fuse element. By laser-blowing a fuse element, the resistance value R is set to a predetermined value. Resistance 2, connected between a node 210 (the gate of transistor 1) and the ground potential GND, applies a constant voltage VG of a product Io·R of the current Io flowing therethrough and the resistance value R to the gate of transistor 1.

Transistor 3 is constituted of a p channel MOS transistor having its substrate and source connected together to node 200, its drain connected to node 210, and its gate connected to the gate and the drain of transistor 4.

Transistor 4 is constituted of a p channel MOS transistor having its source and substrate connected together to node 200, and its drain connected to the gate of transistor 3 and the gate of transistor 4 as well as to constant current source 5. Transistors 3 and 4 constitute a current mirror circuit. In the configuration shown in FIG. 1, it is shown that transistors 3 and 4 supply the same current Io. Constant current source 5 sinks in a constant current Io from transistor 4.

Figure 2:
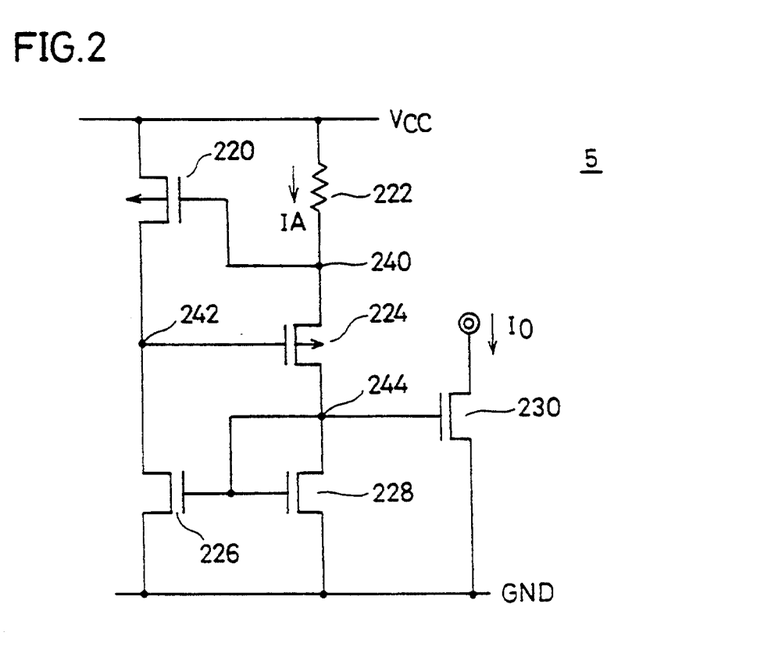
FIG. 2 is a diagram showing a specific configuration of a constant current source shown in FIG. 1.

FIG. 2 is a diagram showing an example of a configuration of the constant current source shown in FIG. 1. FIG. 2 shows an improvement of a circuit described, for example, in "Analog Integrated Circuit Design Technology for VLSI", written by P. R. Gray, et al., published by John Wiley & Sons, Inc. (translated by Y. Nagata et al., and published by Bifukan in Japan).

In FIG. 2, constant current source 5 includes a p channel MOS transistor 220 having its source connected to a power supply voltage Vcc supply node (hereinafter simply referred to as a "power supply voltage Vcc"), its gate connected to a node 240, and its drain connected to a node 242, a resistance 222 having its one end connected to the power supply voltage Vcc and its another end connected to node 240, a p channel MOS transistor 224 having its source connected to node 240, its drain connected to node 244, and its gate connected to node 242, an n channel MOS transistor 226 having its drain connected to node 242, its gate connected to node 244, and its source connected to the ground potential GND, and n channel MOS transistor 228 having its drain connected to node 244, its gate connected to node 244, and its source connected to the ground potential GND, and an n channel MOS transistor 230 having its gate connected to node 244, its source connected to the ground potential GND, and its drain connected to receive the constant current Io. Before describing operations of the clamping circuit shown in FIG. 1, brief description will be given on constant current source 5 shown in FIG. 2.

Transistors 226 and 228 constitute a current mirror circuit. Transistors 228 and 230 also constitute a current mirror circuit. Consider the case where the current IA flows to resistance 222. The potential of node 240 attains Vcc—IA·R222 according to the current IA. R222 shows the resistance value of resistance 222.

Consider the case where the current IA is smaller than a predetermined value. In this case, the potential of node 240 increases, conductance of transistor 220 decreases, and the potential of node 242 is lowered, causing conductance of transistor 224 to increase, current flowing through resistance 222 to increase, and the potential of node 240 to decrease.

As a result, conductance of transistor 220 again increases, the potential of node 242 increases, and conductance of transistor 224 decreases, causing constant current to flow through resistance 222 normally. Current flowing through transistor 224 is applied to transistor 228 through node 244. Node 244 is connected to the gates of transistors 226, 228 and 230. This results in the same current amount flowing through transistors 226, 228 and 230 (when the sizes of the transistors 226, 228, 230 are the same).

Therefore, the current amount flowing through node 244 is the same as the current amount flowing through node 242. Finally, the current amount flowing through resistance 222 is the same as that flowing through transistor 220. Normally, the current IA flowing through resistance 222, that is, the current I flowing through node 244, is given by the following equation:

$$I = |Vthp|/R222$$

where the threshold voltage of transistor 220 is Vthp. Constant current identical or corresponding to the current I flows through transistor 230.

The above-described configuration is called a threshold voltage reference type bias circuit. The above-described current approximate expression is implemented by selecting a sufficiently small bias current IA, and a large ratio (W/L) of the gate width to the gate length of transistors 220.

Figure 3:
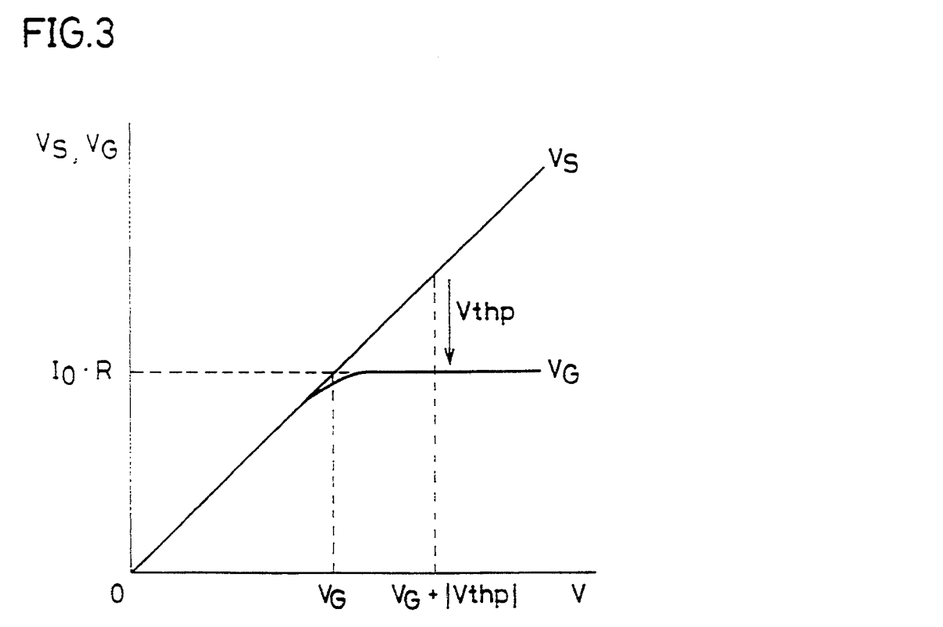
FIG. 3 is a diagram showing a relation between a gate voltage and a source voltage of a clamping MOS transistor shown in FIG. 1 and a voltage to be clamped.

FIG. 3 is a diagram showing the relation between the source voltage and the gate voltage of the clamping transistor shown in FIG. 1, and a voltage to be clamped. In FIG. 3, the ordinate shows the source voltage VS and the gate voltage VG of clamping transistor 1, and the abscissa shows the voltage V to be clamped in node 200. Description will now be given on operations of the clamping circuit with reference to FIGS. 1 and 3.

The constant current Io is made to flow through transistor 4 by constant current source 5. When gate voltages of transistors 3 and 4 are the same, and both MOS transistors 3 and 4 constituting a current mirror circuit operate in a saturation region, the constant current Io identical to the current Io applied by constant current source 5 is supplied through MOS transistor 3. As a result, the voltage VG at node 210 is VG=Io·R.

The condition under which the MOS transistor operates in a saturation region is as follows.

$$|VDS| \geq |VGS - Vth|$$

In the above, VDS shows a voltage between drain and source of the MOS transistor, VGS shows a voltage between gate and source, and Vth shows a threshold voltage.

When the voltage V applied to node 200 decreases, transistor 3 operates in a non-saturation region. More specifically, when the voltage V applied to node 200 satisfies the following relation:

$$V < VG + |Vthp|$$

the voltage between gate and source of MOS transistor 3 decreases. MOS transistor 3 operates in a non-saturation region, making the amount of current flowing therein smaller than the constant current Io applied by constant current source 5. Normally, a current IDS which the MOS transistor supplies in a non-saturation region is given as follows:

$$IDS = \beta \{2(VGS - Vth)VDS - VDS^2\}$$

When MOS transistor 3 operates in a non-saturation region, the voltage VG of node 210 is:

$$VG \sim V$$

In the above, voltage drop across transistor 3 is ignored.

More specifically, MOS transistor 3 supplies a current from node 200 to node 210. Therefore, only when the potential VG of node 210 is lower than the voltage V applied to node 200, the current is supplied. Therefore, the voltage V which appears at node 210 is ~ V or the constant voltage Io·R according to a value of the voltage V applied to node 200.

MOS transistor 1 has its gate connected to node 210 to receive the voltage VG. MOS transistor 1 has its source connected to node 200 to receive the voltage V. Therefore, the gate voltage VG and the source voltage of VS of MOS transistor 1 are as shown in FIG. 3. More specifically, when the voltage V of node 200 exceeds a constant value (Io·R, in which voltage drop across transistor 3 is ignored), the gate voltage VG holds a substantially constant value. On the other hand, the source voltage VS of the transistor 1 changes according to the voltage V of node 200.

The voltage between gate and source of MOS transistor 1 is obtained as a potential difference (VG−VS) between two curves (VS and VG) shown in FIG. 3. The potential difference (VG−VS) is ordinarily a negative value because the source is assumed to be the reference for the measurement.

When the absolute value of the voltage between gate and source, that is, $|VG - VS| = |VG - V|$, is larger than the absolute value of the threshold voltage Vthp, that is, $|Vthp|$, MOS transistor 1 is turned on to make the current I flow. The current I is given as follows:

$$\begin{aligned} I &= \beta \cdot (|VG - V| - |Vthp|)^2 \\ &= \beta \{V - (VG + |Vthp|)\}^2 \end{aligned}$$

Figure 4:
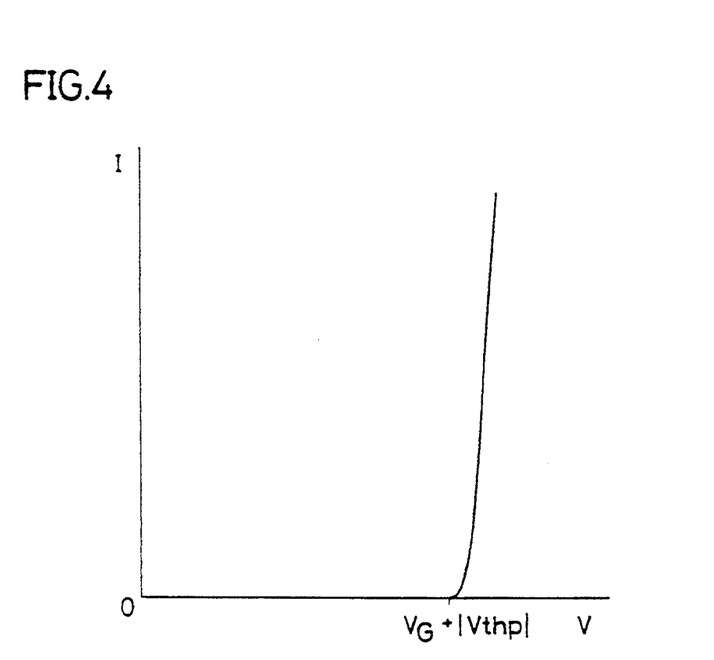
FIG. 4 is a diagram showing a current-voltage characteristic of the clamping MOS transistor shown in FIG. 1.

Therefore, as shown in FIG. 4, when the voltage V applied to node 200 exceeds the voltage value VG+|Vthp|, the current I according to a square characteristic flows through transistor 1. As a result, the voltage V in node 200 is clamped within a range up to the voltage value VG+|Vthp|.

In FIG. 4, the ordinate shows the current I and the abscissa shows the voltage V.

As described above, by using one MOS transistor as a clamping transistor, the voltage-current characteristic of the clamping circuit is a square characteristic. A voltage-current characteristic as rapidly as that of a single MOS transistor can be obtained. It is possible to follow change of the voltage V in node 200 at a high speed, whereby it is possible to clamp the voltage V to a predetermined potential precisely.

The clamping potential is determined by the potential VG of node 210 (the gate of MOS transistor 1). The potential of node 210 is determined by the resistance value of trimming resistance 2. Therefore, the clamping potential can be set to an arbitrary value with ease and precision.

Figure 5:
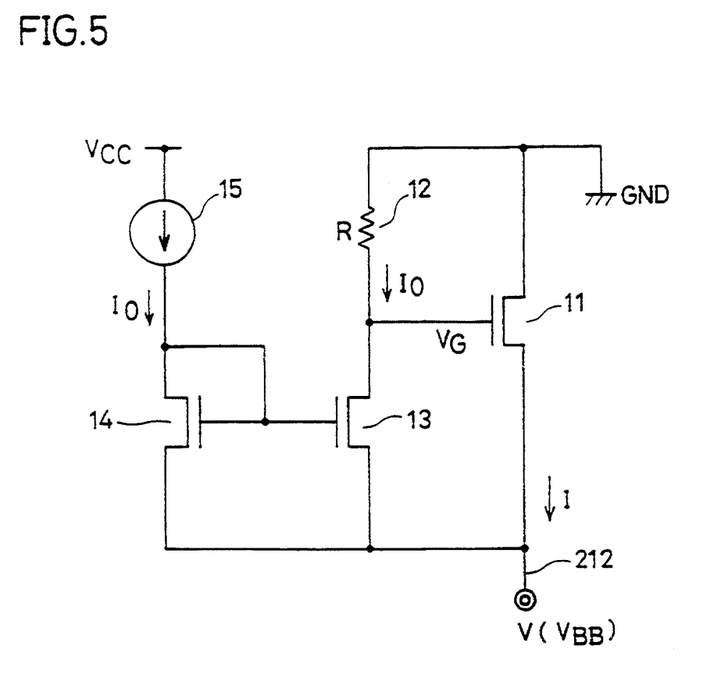
FIG. 5 is a diagram showing a configuration of a clamping circuit of another embodiment of the present invention.

FIG. 5 is a diagram showing a configuration of a clamping circuit according to another embodiment of the present invention. In FIG. 5, the clamping circuit includes a clamping n channel MOS transistor 11 for supplying the current I from the ground potential GND to a node 212, a trimming resistance 12 connected between the ground potential GND and the gate of MOS transistor 11, an n channel MOS transistor 13 for regulating the amount of current flowing through trimming resistance 12, a constant current source 15 supplying the constant current Io, and an n channel MOS transistor 14 receiving the constant current Io from constant current source 15. MOS transistor 14 has its gate and drain interconnected, operates in a saturation region, and causes the same amount of current flow as the current Io from constant current source.

MOS transistors 13 and 14 constitute a current mirror circuit. In an ordinary operation, the same amount of current Io as the current Io flowing through MOS transistor 14 flows through MOS transistor 13. In this state, the gate voltage VG of MOS transistor 11 is −Io·R. It is assumed that the ground potential GND is 0 V. MOS transistor 11 has its source connected to node 212, is brought into an on/off state according to the potential difference between the potential V of node 212 and the gate voltage VG, and supplies a current according to the potential difference to node 212.

More specifically, when the voltage V of node 212 is below VG−Vthn, MOS transistor 11 is turned on, and supplies the current Io node 212. In other words, MOS transistor 11 clamps the voltage V of node 212 to the potential of −Io·R−Vthn. Vthn is a threshold voltage of MOS transistor 11.

The configuration of the clamping circuit shown in FIG. 5 can be essentially implemented by replacing conduction types of channels of the MOS transistors in the clamping circuit shown in FIG. 1. Therefore, the clamping circuit of FIG. 5 carries out clamping operations similar to those of the clamping circuit shown in FIG. 1. More specifically, MOS transistor 13 regulates the amount of current flowing through trimming resistance 12 according to the potential level of the voltage V of node 212, thereby regulating the potential level of the gate voltage VG of transistor 11. In this configuration, the voltage V of node 212 is clamped to a predetermined negative potential level. The clamping circuit shown in FIG. 5 is provided in an output stage of a circuit generating the substrate bias voltage VBB of a negative potential.

Figure 6:
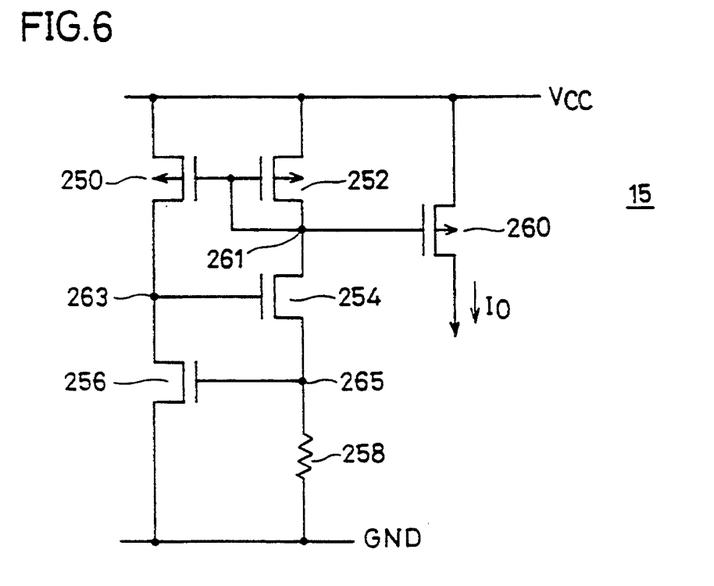
FIG. 6 is a diagram showing a specific configuration of a constant current source shown in FIG. 5.

FIG. 6 is a diagram showing an example of a specific configuration of the constant current source shown in FIG. 5. In FIG. 6, a constant current source 15 includes p channel MOS transistors 250 and 252 having their sources connected to the power supply voltage Vcc and constituting a current mirror circuit, an n channel MOS transistor 254 having a gate connected to a node 263, one conduction terminal connected to a node 261, and another conduction terminal connected to a node 265, an n channel MOS transistor 256 having a gate connected to node 265, one conduction terminal connected to node 263, and the other conduction terminal connected to the ground potential GND, a resistance 258 connected between node 265 and the ground potential GND, and a p channel MOS transistor 260 having a source connected to the power supply voltage Vcc, a gate connected to node 261, and a drain connected to provide the current Io.

The configuration of constant current source 15 shown in FIG. 6 can be implemented by reversing conduction types of the MOS transistor of the components and by replacing the power supply voltage Vcc with the ground potential GND in the configuration of the constant current source shown in FIG. 2. Therefore, operations of constant current source 15 shown in FIG. 6 are the same as those of constant current source 5 shown in FIG. 2. Feedback operations of MOS transistors 254 and 256 cause constant current to flow through resistance 258, and current mirror operations of MOS transistors 250 and 252 cause the same current flow as that of resistance 258 to flow through MOS transistor 256. Transistors 252 and 260 constitute a current mirror circuit. Therefore, the constant current Io is provided from MOS transistor 260. The potential level of node 265 is substantially the same as the threshold voltage Vth of MOS transistor 256. This condition can be implemented by sufficiently decreasing the bias current flowing through transistor 256, and by selecting a large ratio of channel width and channel length (W/L) of MOS transistor 256, as described regarding the constant current source shown in FIG. 2.

In the configuration of the clamping circuit shown in FIG. 5, constant current source 15 is connected between MOS transistor 14 and the power supply voltage Vcc. This is because the substrate bias voltage VBB is approximately −2 to −3 V of small absolute value, while the boost signal Vpp is ordinarily at 6 to 8 V level. More specifically, in the configuration of constant current source 15 shown in FIG. 6, for example, in order to supply the constant current Io stably from MOS transistor 260, the potential difference of 2·|Vthp| is required in p channel MOS transistor 260 (the gate potential of transistor 260 is dropped from the power supply voltage by |Vthp|. Therefore, in this configuration, constant current source 15 may not be supplied with current from the ground potential GND.

However, when the absolute value of the negative voltage which appears at node 212 is sufficiently large, it is possible to arrange constant current source 15 between MOS transistor 14 and the ground potential GND (cf. the configuration of FIG. 1). In other words, a configuration in which constant current source 15 is connected to the ground potential GND in place of the power supply voltage Vcc can also be used.

Figure 7:
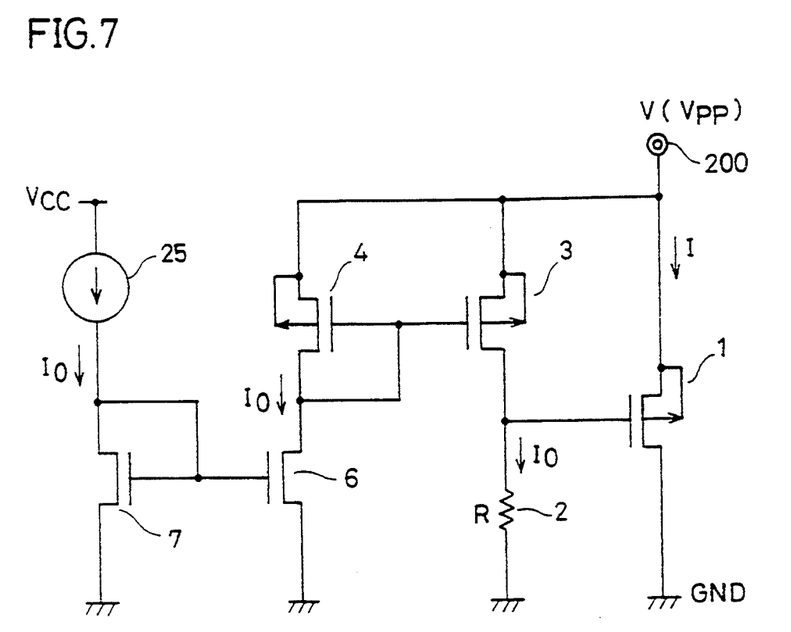
FIG. 7 is a diagram showing a configuration of a clamping circuit of a further embodiment of the present invention.

FIG. 7 is a diagram showing a configuration of a clamping circuit according to a further embodiment of the present invention. The clamping circuit shown in FIG. 7 is a modification of the clamping circuit shown in FIG. 1. More specifically, in place of constant current source 5 in the clamping circuit shown in FIG. 1, n channel MOS transistors 6 and 7 and a constant current source 25 are provided. n channel MOS transistor 7 has its gate and drain connected together, its drain connected to receive the constant current Io from constant current source 25, and its source connected to the ground potential GND. n channel MOS transistor 6 has its drain connected to the gate and drain of p channel MOS transistor 4, its source connected to the ground potential GND, and its gate connected to the gate of MOS transistor 7. More specifically, MOS transistors 6 and 7 constitute a current mirror circuit, and ordinarily operates in a saturation region to cause the same current Io flow.

p channel MOS transistors 3 and 4 constitute a current mirror circuit similar to the case of the clamping circuit shown in FIG. 1. p channel MOS transistors 3 and 4 supply the constant current Io to trimming resistance 2, and set the gate potential of clamping transistor 1 to a predetermined potential. Operations of the clamping circuit shown in FIG. 7 are the same as those of the clamping circuit shown in FIG. 1.

According to the configuration shown in FIG. 7, it is possible to arrange a constant current circuit (constant current source 25 and MOS transistor 7) between the power supply potential Vcc and the ground potential GND. At the time of power-on, the boost signal Vpp is brought into a stable state after the power supply voltage Vcc is brought into a stable state (the boost signal Vpp is generated from the power supply voltage Vcc). Therefore, by configuring the constant current circuit such that the current is supplied from the power supply voltage Vcc to the ground potential GND as shown in FIG. 7, the power supply voltage Vcc is in a stable state at the time of power-on. On the other hand, even in the case of an unstable state of the boost signal Vpp, constant current source 25 can supply the constant current Io stably, unstable boost signal Vpp can be prevented from being clamped unnecessarily, and the clamping circuit operates stably. The configuration of the constant current source shown in FIG. 6, for example, can be used for constant current source 25 shown in FIG. 7.

Figure 8:
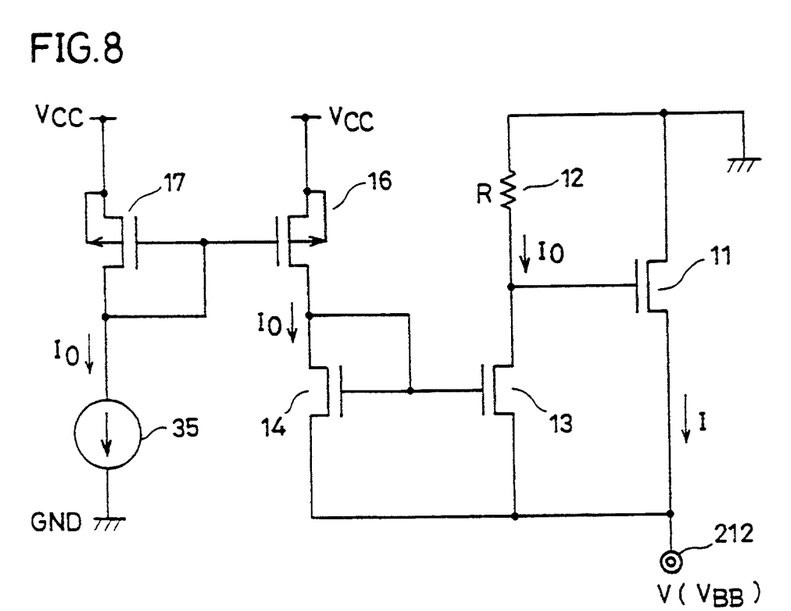
FIG. 8 is a diagram showing a configuration of a clamping circuit of a further embodiment of the present invention.

FIG. 8 is a diagram showing a configuration of a clamping circuit according to a further embodiment of the present invention. The clamping circuit shown in FIG. 8 is a modification of the clamping circuit shown in FIG. 5. Portions corresponding to those of the clamping circuit shown in FIG. 5 are denoted by the same reference characters. The clamping circuit shown in FIG. 8 includes p channel MOS transistors 16 and 17 and a constant current source 35, in place of constant current source 15 of the clamping circuit shown in FIG. 5. p channel MOS transistor 17 has its gate and drain interconnected, and supplies the current Io from the power supply voltage Vcc to constant current source 35. p channel MOS transistor 16 constitutes a current mirror circuit together with p channel MOS transistor 17 to supply the predetermined current Io to n channel MOS transistor 14.

In this configuration, constant current source 35 receives a current from the power supply voltage Vcc through MOS transistor 17. Therefore, at the time of power-on, when the power supply voltage Vcc is stabilized, the constant current Io is produced stably to sink in the constant current Io from p channel MOS transistor 16 by current mirror operation. As a result, in n channel MOS transistors 13 and 14 constituting another current mirror circuit, the predetermined current Io can be produced, respectively. Therefore, a clamping circuit can be obtained which can generate the current Io stably, prevent unnecessary clamping operations to the unstable substrate bias voltage VBB, and which can operate stably even in the state where the substrate bias voltage VBB is not stabilized at the time of power-on. The circuit configuration shown in FIG. 2 can be used as constant current source 35 shown in FIG. 8.

As described above, in a path different from a clamping node (200 or 212), a constant current circuit is constituted between the power supply voltage Vcc and the ground potential GND, and the gate voltage of the clamping transistor is regulated by using the constant current generated from the constant current circuit. As a result, a circuit configuration can be obtained which can supply the constant current Io stably and prevent clamping operations by the unstable current caused by the unstable clamping voltage (Vpp or VBB), and which can carry out clamping operations stably, even in the state where the clamping voltage (Vpp or VBB) is unstable at the time of power-on.

In the above-described embodiments, a word line drive signal, a program high voltage or a sense amplifier disconnection/connection signal in a shared sense amplifier and a substrate bias voltage in a semiconductor memory are described as a voltage to be clamped. However, the clamping circuit of the present invention can be applied to every voltage generated on-chip or in circuit from the power supply voltage Vcc.

The present invention may also be configured so that a constant current of a value different from that of the current Io supplied by a constant current source flows through a trimming resistance.

As described above, according to the present invention, since clamping operations are carried out by using one transistor element, a clamping circuit can be implemented with a voltage-current characteristic having rapid rising.

Since one-stage transistor element regulating a current flowing through a clamping node according to a reference potential from a reference potential generating circuit is used, it is possible to change the current flowing through the clamping node at a high speed in response to change of the potential at the clamping node, whereby it is possible to obtain a clamping circuit which can clamp the reference potential to a predetermined potential precisely at a high speed.

Since a voltage generating circuit including a trimming resistance generating a voltage according to a constant current from a constant current supplying circuit, and a clamping circuit regulating an amount of current flowing through a clamping node according to a voltage generated by the voltage generating circuit are provided, it is possible to implement easily a clamping voltage of an arbitrary level by regulating a resistance value of the trimming resistance to an appropriate value. Since one field effect transistor is used as a clamping transistor, it is possible to implement a clamping circuit with a rapid voltage-current characteristic.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A circuit for clamping a voltage appearing at a first node, comprising:
   reference voltage generating means, provided between said first node and a reference potential supply node supplying a reference potential, for generating a predetermined reference voltage different from said reference potential; and
   a clamping transistor element including a field effect transistor having one conduction electrode node coupled to said first node, another conduction electrode node coupled to said reference potential supply node, and a control electrode node coupled to receive said predetermined reference voltage from said reference voltage generating means.

2. A circuit for clamping a voltage appearing at a first node, comprising:
   constant current supply means for supplying a constant current to an output node;
   voltage generating means, including a trimmable resistive element and provided between said output node and a second node receiving a reference potential, for generating a voltage according to a current supplied by said constant current supply means; and
   clamping means including one field effect transistor and responsive to the voltage generated by said voltage generating means for regulating an amount of current flowing between said first node and said second node to clamp a potential of said first node to a predetermined potential.

3. The circuit as recited in claim 2, wherein said constant current supply means includes a transistor element provided between said first node and said trimmable resistive element and responsive to a value of the voltage of said first node for supplying a current to said trimmable resistive element.

4. The circuit as recited in claim 3, wherein said field effect transistor is a p channel transistor, and said transistor element supplies a current to said trimmable resistive element when a potential of said first node exceeds a predetermined level, and a voltage generated at said trimmable resistive element is applied to a control gate of said field effect transistor.

5. The circuit as recited in claim 3, wherein said field effect transistor comprises an n channel field effect transistor, and,
   said transistor element supplies a current flow from said trimmable resistive element to said first node when a potential at said first node goes below a predetermined level, a potential generated at said trimmable resistive element being applied to a control gate of said field effect transistor.

6. The circuit as recited in claim 2, wherein said constant current supply means includes a current source for supplying a predetermined constant current flow to said second node, a first transistor element for supplying a current flow from said first node to said current source, and a second transistor element coupled between said first node and said output node such that said first and second transistor elements form a current mirror circuit.

7. The circuit as recited in claim 6, wherein said current source includes a current supply for supplying a predetermined constant current flow from a third node receiving another reference voltage, a third transistor element for receiving the predetermined current flow from said current supply, and a fourth transistor element coupled between said first transistor element and said second node in a current mirror arrangement with said third transistor element.

8. The circuit as recited in claim 2, wherein said constant current supply means includes a current source for supplying a predetermined current flow from a third node receiving another reference voltage, a first transistor element receiving the predetermined current flow from said current source, and a second transistor element coupled between said output node and said second node so as to form a current mirror circuit with said first transistor element.

9. The circuit as recited in claim 8, wherein said current source includes a current supply for supplying a predetermined current flow to said second node, a third transistor element coupled between said third node and said current supply to supply a current flow to said current source, and a fourth transistor element connected between said third node and said output node in a current mirror arrangement with said third transistor element.

10. The circuit as recited in claim 2, wherein said voltage appearing at said first node is a boosted word line drive signal to be transmitted on a selected word line in a memory array in a memory device.

11. The circuit as recited in claim 2, wherein said voltage appearing at said first node is a bias voltage to be applied to a semiconductor substrate having a component formed thereon.

12. The circuit as recited in claim 2, wherein said voltage appearing at said first node is a boosted control signal for connecting a selected bit line with a sense amplifier in a shared sense amplifier arrangement in a semiconductor memory device.

13. A circuit comprising:
    current adjusting means provided between a clamp node and a reference node and having a control node for supplying a current flow between said clamp node and said reference node according to a voltage applied at said control node;
    current supply means between said clamp node and said reference node for supplying a predetermined current flow between said clamp node and said control node when there is a voltage difference between said clamp node and said reference node; and
    voltage generating means between said control node and said reference node and responsive to a current flow from said current supply means for generating a voltage corresponding to a supplied current flow to said control node.

14. A circuit, comprising:
    a reference voltage generator for generating a reference voltage;
    a voltage generator responsive to a first operating power supply voltage for generating a voltage of a predetermined level at a first node; and
    a clamping element responsive to the reference voltage and the voltage at said first node for clamping a potential at said first node at a predetermined clamping level determined by a function of said reference voltage,
    wherein said clamping element comprises a transistor element having one conduction electrode node coupled to receive the voltage at said first node, a control gate node coupled to receive said reference voltage, and another conduction electrode node coupled to receive a potential different from said predetermined level and said predetermined clamping level.

15. The circuit of claim 14, wherein said transistor element has said another conduction electrode node coupled to receive a second operating power supply voltage.

16. The circuit of claim 15, wherein said voltage at said first node resides outside a range between said first and second operating power supply voltages.

* * * * *